(12) United States Patent
Tews et al.

(10) Patent No.: US 6,670,235 B1
(45) Date of Patent: Dec. 30, 2003

(54) PROCESS FLOW FOR TWO-STEP COLLAR IN DRAM PREPARATION

(75) Inventors: Helmut Horst Tews, Poughkeepsie, NY (US); Stephan Kudelka, Fishkill, NY (US); Oliver Genz, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/939,554

(22) Filed: Aug. 28, 2001

(51) Int. Cl.[7] .......................................... H01L 21/8242
(52) U.S. Cl. ...................................... 438/246; 438/389
(58) Field of Search ................................ 438/243–249, 438/FOR 212, 386–392

(56) References Cited

U.S. PATENT DOCUMENTS

| | | | |
|---|---|---|---|
| 5,395,786 A | 3/1995 | Hsu et al. | 437/52 |
| 5,656,535 A | 8/1997 | Ho et al. | 438/386 |
| 6,365,485 B1 * | 4/2002 | Shiao et al. | 438/249 |
| 6,423,594 B1 * | 7/2002 | Tsai et al. | |
| 6,440,792 B1 * | 8/2002 | Shiao et al. | |
| 2001/0044180 A1 * | 11/2001 | Schrems | 438/249 |
| 2001/0055846 A1 * | 12/2001 | Beckmann et al. | 438/243 |

* cited by examiner

Primary Examiner—George Fourson

(57) ABSTRACT

In a method of forming a DRAM cell in a semiconductor substrate, the improvement of maintaining a substantially full trench opening during trench processing comprising: a) forming a pad nitride on the surface of the substrate and reactive ion etching (RIE) a trench vertically to a first depth; b) depositing a nitride layer in the trench; c) filling the trench with a poly silicon fill; d) recess etching the fill to the collar depth; e) oxidizing to transform the exposed nitride layer into a nitrided oxide collar or depositing an oxide on the layer of nitride; f) reactive ion etching to open the bottom oxide; g) stripping the poly fill trench, and performing a nitride etch selective to oxide; h) expanding the trench horizontally by etching lower trench sidewalls and bottom while masking the upper sidewalls; i) forming a buried plate at the bottom of the trench sidewalls; j) forming the node dielectric in the deep trench to grow a collar oxide that consists of a nitrided oxide and a layer of node nitride; k) filling the trench with a poly fill; l) recess etching the poly fill approximately to the collar bottom; m) depositing a collar oxide; n) reactive ion etching to open the bottom; o) filling the trench with a poly fill; and p) chemically mechanically polishing the semiconductor substrate.

10 Claims, 2 Drawing Sheets

PROCESS FLOW FOR TWO-STEP COLLAR IN DRAM PREPARATION

BACKGROUND OF THE INVENTION

1. Field of the Invention

The invention relates to Dynamic Random Access Memories (DRAMS), and more particularly to improvement in the process of preparing DRAMS to overcome the small opening of a DRAM trench due to the small ground rules in the formation of an isolation collar on trench sidewalls, by utilizing a process flow which uses a thin dielectric replacement collar for all DT processes until the DT fill, and after a recess, forming the final collar in a second step.

2. Description of the Prior Art

Deep trench (DT) based storage devices are used in DRAM cells, and these devices are generally etched from about 4 to 8 microns deep into the silicon substrate. Further, while the process for forming the deep trench differs between 4 Mb up to 1GB DRAM cells, nevertheless, there are a certain number of process steps common to each of the five generations of DRAM cells.

The commonly used deep trench processing steps, which form a large portion of the cost of making each of these trench-based DRAM cells are:

- etching of a deep trench;
- deposition of a node dielectric by low pressure chemical vapor deposition (LPCVD) of SiN;
- reoxidation of the node dielectric;
- deposition of a first polysilicon fill using LPCVD;
- chemical mechanical polish of the first polysilicon fill;
- etching of a first recess in the first polysilicon fill using reactive ion etching (RIE);
- deposition of a collar oxide;
- etching of the collar oxide at the bottom using RIE;
- deposition of a second polysilicon fill using LPCVD; and
- chemical mechanical polish of the second polysilicon fill.

A connection between the storage trench and its associated array transistor is provided by a third polysilicon recess that is generally etched about 50 nm below the silicon surface. This processing step is generally referred to as the "buried strap formation". The process step of forming the buried strap formation complicates the deep trench process.

A method of fabricating a storage node for a deep trench-based DRAM on a semiconductive substrate is disclosed in U.S. Pat. No. 5,656,535. The method entails:

- etching a trench in a surface of the substrate;
- forming a layer of dielectric material on a sidewall of the trench;
- partially removing the layer of dielectric material to expose an underlying region of an upper portion of the sidewall;
- growing a layer of oxide on the upper portion of the sidewall;
- removing a portion of the layer of oxide from the sidewall to orient the layer of oxide a predetermined distance from the surface of the substrate; and
- filling the trench with a semiconductive material.

U.S. Pat. No. 5,395,786 disclose a method for forming a DRAM cell in a semiconductor substrate of a first polarity comprising:

- forming a temporary protective layer on the surface of the substrate;
- etching a trench vertically to a first depth, exposing upper trench sidewalls and a first trench bottom;
- expanding the trench horizontally by substantially isotropic etching of the upper trench sidewalls under the temporary protective layer to form trench collar sidewalls displaced from the upper trench sidewalls by a sidewall offset distance;
- forming a layer of collar dielectric having a thickness substantially equal to the sidewall offset distance on the collar sidewalls and on the first trench bottom;
- removing the collar dielectric from at least the first trench bottom;
- etching the trench further through the first trench bottom to a final trench depth having a final trench bottom and lower trench sidewalls;
- doping the lower trench sidewalls with a sidewall dose of the second polarity;
- forming a trench dielectric on at least the lower trench sidewalls;
- forming an inner electrode within the trench etching the inner electrode and the collar dielectric to a strap depth, thereby exposing a strap contact surface on a portion of the collar sidewalls and an electrode contact surface on the top of the inner electrode;
- forming a conductive strap between the strap contact surface and the inner electrode; and
- forming an access transistor having a strap contact electrode abutting the strap contact surface.

The conventional methods known in the art for forming a collar in the upper part of the DRAM trench suffer from the following drawbacks:

If the collar formation is done after the formation of the storage capacitor in the bottom part of the trench, it is not possible to use techniques like trench bottle process or self aligned formation of a buried plate. Both these techniques require the collar to be in place at the beginning of the trench processing.

Alternatively, if the collar formation is done before the formation of the storage capacitor in the bottom part of the trench, bottle formation and self aligned buried plate formation are possible. However, the small trench opening is significantly reduced by the formation of the isolation collar on the trench sidewalls. It is therefore extremely difficult to execute all DT process steps after collar formation. In addition, the thickness of the polysilicon layer in the trench acting as inner electrode of the storage capacitor is extremely thin.

Accordingly, there is a need in the art of preparing a trench DRAM processing scheme to devise a means to provide as complete a full trench opening as possible during trench processing—and this is especially important when node dielectric with high dielectric constants are used.

SUMMARY OF THE INVENTION

One object of the present invention is to provide a process for eliminating the very small opening of a DRAM trench in the usual trench DRAM processing for small ground rules.

Another object of the present invention is to provide a process for eliminating the very small opening of a DRAM trench in the usual trench DRAM processing for small ground rules, in which the small opening has been further reduced by the formation of an isolation collar on the trench sidewalls.

A further object of the present invention is to provide a process for eliminating the very small opening of a DRAM trench in usual trench DRAM processing for small ground rules, in which the small opening has been further reduced by the formation of an isolation collar on the trench sidewalls, wherein it is extremely difficult to execute all DT process steps after collar formation until the DT fill.

The foregoing and other objects of the present invention will become apparent by reference to the drawings and detailed description of the preferred embodiment hereinafter set forth.

DETAILED DESCRIPTION OF PREFERRED EMBODIMENT OF THE INVENTION

Figure 1:
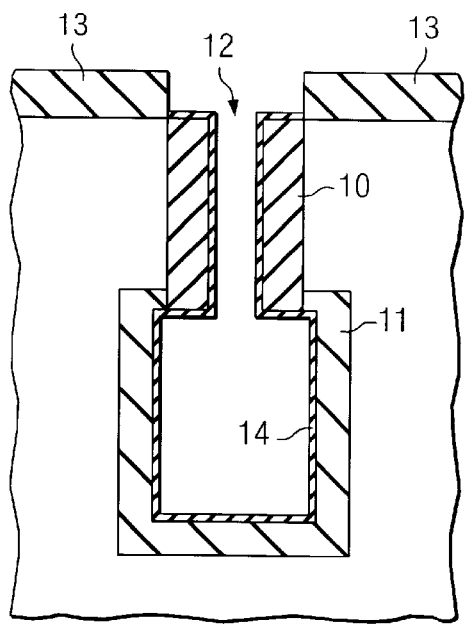
FIG. 1 is a graphic depiction of a cross-sectional view of the usual deep trench DRAM from a process scheme in which there is a reduction of the trench opening due to collar formation.

The present invention describes a process for making a DRAM in which the process results in a full trench opening during trench processing. This full trench opening is especially important when node dielectrics with high dielectric constants are used. These collar layers that result from fuller trench openings allow the use of larger node thicknesses, i.e. 1.5 to 4 fold dielectric thicknesses for the same oxide equivalent thickness.

For example, when considering the capacity of a system consisting of two conducting plates and a dielectric in between, it is governed by the formula:

$$Cox = \frac{\varepsilon}{tox}$$

Where Cox is the capacity per unit area, c is the dielectric constant, and tox is the thickness of the dielectric layer. Doubling the dielectric constant allows a doubling of the thickness of the layer to obtain the same capacity as previously. The advantage of a larger thickness is the benefit of a low leakage current.

In the context of the invention, a material with a high dielectric constant will mean values of 10 or more. Typical values for the following dielectric materials are:

$Al_2O_3$–8–10

$ZrO_2$–25

$HfO_2$–25

One choice would be $Al_2O_3$ with a thickness 1.5 times that of nitride, or $ZrO_2$ with a thickness of 4 times that of the nitride.

In general, the invention method is accomplished by:

forming a pad nitride on the surface of the substrate and reactive ion etching (RIE) a trench vertically to a first depth;

depositing a nitride layer in the trench;

filling the trench with a single crystal silicon or poly silicon fill;

recess etching the fill to the collar depth;

oxidizing to transform the exposed nitride layer into a nitrided oxide collar or depositing an oxide on the nitride layer;

reactive ion etching to open the bottom oxide;

stripping the poly fill and performing a nitride etch selective to oxide;

expanding the trench horizontally to make a bottle formation by etching lower trench sidewalls and bottom while masking the upper sidewalls;

forming a buried plate at the trench sidewalls below the collar;

forming a node dielectric layer in the deep;

filling the trench with polysilicon fill;

recess etching the poly fill approximately to the collar bottom;

depositing the collar oxide;

reactive ion etching to open the bottom;

filling the trench with a poly fill; and chemically mechanically polishing the silicon for better planarization.

Formation of the buried plate is by plasma doping or gas phase doping with an inert carrier gas and a dopant gas. The inert gas may be selected from Ar, He, $N_2$ and $H_2$. The dopant containing gas may be selected from the group consisting of arsine, tertiarybutylarsine, trimethylarsenic, triethylarsenic, phosphine, tertiarybutyphosphine, trimethylphosphine, triethylphosphine and diborone.

The invention trench DRAM process is a marked departure from the usual collar processing scheme in which thick collar layers are deposited before the formation of the storage capacitor in the lower part of the trench resulting in small trench openings that severely limit the use of high k node dielectric materials, and resulting in thin polysilicon layers on top of the node in the trench.

The invention trench DRAM process is also marked departure from the collar processing schemes in which thick collar layers are deposited after the formation of the storage because the invention process allows for trench bottle processing and self aligned buried plate doping.

Reference is now made to prior art FIG. 1, which shows a trench DRAM processed by the usual processing scheme that produces formation of a dielectric collar at the first step after the DT etch. The collar 10 is required during processing for the bottle formation and for the gas phase doping of the buried plate 11, such that, after completion of the DRAM process the collar serves as an isolation layer and suppresses vertical parasitic transistor action.

As can be seen from FIG. 1, the reduction of the trench opening 12 due to formation of the collar 10 is substantial. This reduced trench opening limits the use of thick high k materials and severely limits the thickness of the polysilicon inner electrode.

Figure 2:
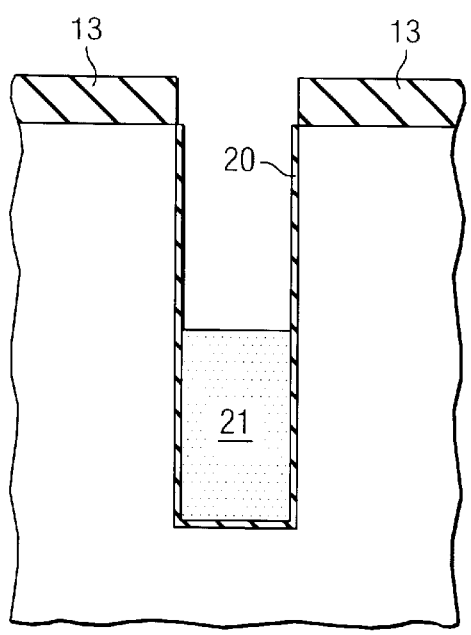
FIG. 2 is a graphic depiction of a cross-sectional view of a deep trench DRAM from commencement of the invention trench DRAM processing scheme which starts with a thin replacement collar for bottle formation, gas phase doping, node process and trench fill.

In FIG. 2, the graphic depiction of the trench DRAM resulting from the process scheme of the present invention starts with a thin replacement collar for bottle formation and gas phase doping, as well as the node process and trench fill. First there is a DT etch followed by deposition of a thin nitride layer 20. Thereafter, a poly fill 21 is deposited followed by recess of the poly to a lower collar depth.

Figure 3:
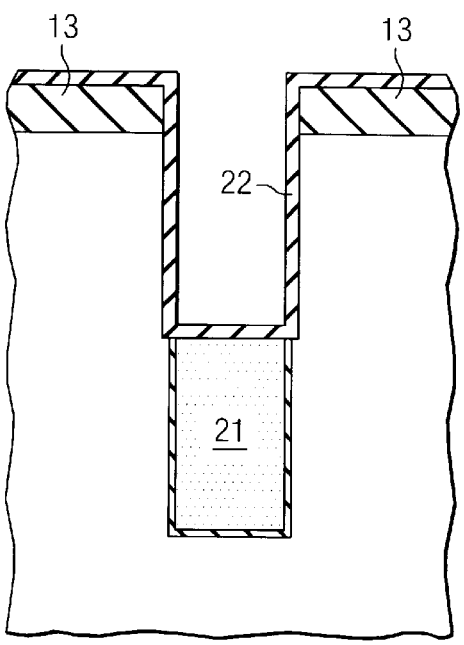
FIG. 3 is a graphic depiction of a cross-sectional view of the trench DRAM of FIG. 2 in which oxidation has transformed the exposed part of the nitride layer into a nitrided oxide.

In the next step of the invention process, as shown in FIG. 3, the nitride layer is subjected to a steam oxidation process which results in transforming the exposed parts of the nitride layer into a nitrided oxide 22.

Figure 4:
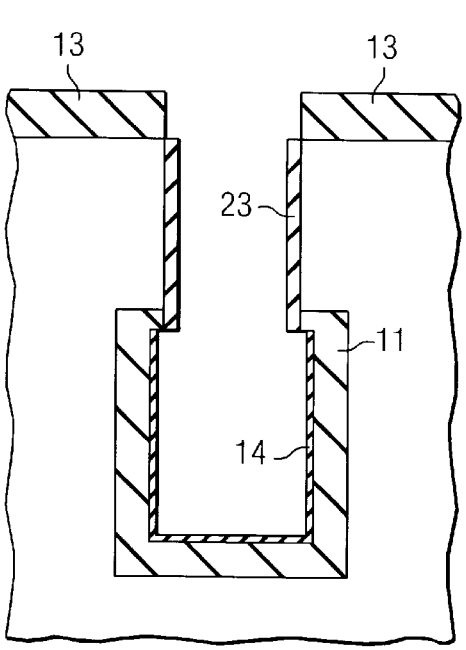
FIG. 4 is a graphic depiction of a cross-sectional view of the deep trench DRAM of FIG. 3 in which there has been a RIE opening of the bottom oxide, strip of poly trench fill, nitride etch selective to oxide, bottle process, buried plate process, and node process in which the collar consists of a thin layer of nitrided oxide plus a layer of node nitride.
Figure 5:
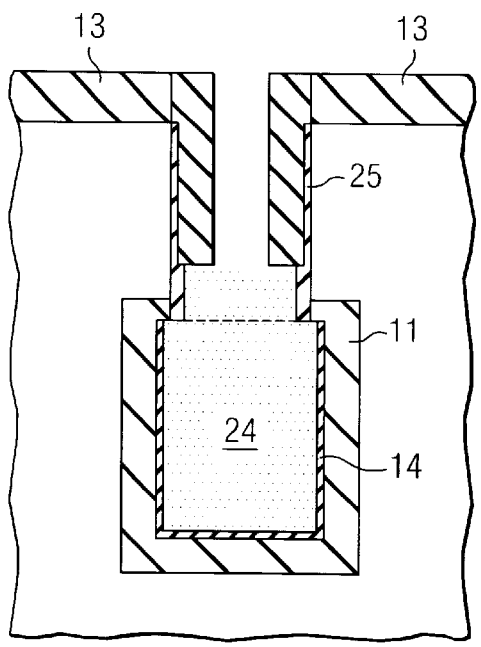
FIG. 5 is a graphic depiction of a cross-sectional view of the deep trench DRAM of FIG. 4, in which there has been employed the steps of a poly fill and poly CMP, collar deposition, and collar RIE. The polysilicon trench fill is uniform due to a substantial full trench opening made available during the invention trench processing.

Thereafter, as can be seen in FIG. 4, reactive ion etching (RIE) is employed to open the bottom oxide, followed by a stripping of the poly trench fill. Next, a nitride etch that is selective to the oxide is employed, followed by the bottle process, and the buried plate process, which in turn is followed by the node process to produce a node 23. At this point, the collar consists of a thin layer of nitrided oxide plus a layer of node nitride.

The process steps following arrival at the portion of DRAM trench shown in FIG. 4, commences with a trench poly fill 24 and etch selective to oxide, there is no expansion of the trench walls beyond the outside circumference of the original trench.

Figure 6:
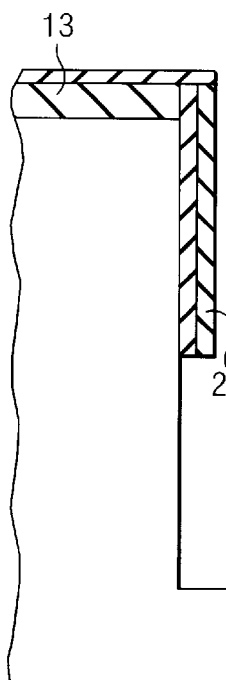
FIG. 6 is an alternative embodiment of FIG. 4 where a thin oxide layer was deposited on the nitride layer followed by a reactive ion etching to open the bottom oxide, followed by stripping the poly silicon trench fill and performing a nitride etch selective to oxide. There is no expansion of the trench walls beyond the outside circumference of the original trench.
Figure 7:
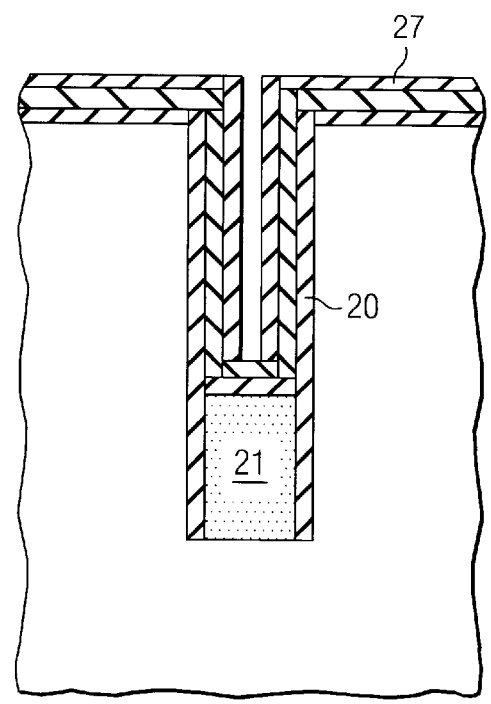
FIG. 7 is an alternative embodiment when a larger selectivity for poly strip is needed. It shows the replacement collar formation to FIGS. 3 or 6. An additional nitride layer is deposited on top of the oxide layer followed by a RIE open step. A poly strip selective to the nitride step is next performed followed by a nitride etch.

If a larger selectivity for the chemical strip of the poly fill is needed, this may be accommodated as shown in the alternative embodiment of FIG. 7 when a larger selectivity for poly strip is needed. It shows the replacement collar formation 27 to FIGS. 3 or 6. An additional nitride layer is deposited on top of the oxide layer followed by a RIE open step. A poly strip selective to the nitride step is next performed followed by a nitride etch.

It is apparent that, in the usual collar scheme with thick collar layers deposited before the node process, the small trench opening severely limits the use of high k node materials and severely limits the use of low resistance trench fill.

We claim:

1. In a method of forming a deep trench DRAM cell in a semiconductor substrate, the improvement of maintaining a substantially large trench opening during trench processing comprising:

a) forming a pad nitride on the surface of the substrate and reactive ion etching (RIP,) a trench vertically to a first depth;

b) depositing a nitride layer in said trench;

c) filling said trench with fill material;

d) recess etching said fill material to a collar depth;

e) oxidizing to transform the resulting exposed portion of the nitride layer into a nitrided oxide collar or depositing an oxide layer on the layer of nitride;

f) reactive ion etching oxide on the fill material wherein the fill material is exposed to open the bottom oxide;

g) stripping the fill material and selectively etching the resulting exposed portion of the nitride layer with respect to the oxide;

h) expanding said trench horizontally by etching lower trench sidewalls arid bottom while masking the upper sidewalls;

i) forming a buried plate at the bottom of said trench sidewalls;

j) forming a node dielectric in the trench including growing a collar oxide that consists of a nitrided oxide and a layer of node nitride;

k) then filling said trench with a second polysilicon fill;

l) recess etching said second poly fill approximately to the collar bottom;

m) then depositing a collar oxide;

n) reactive ion etching oxide on the second polysilicon fill material wherein the fill material is exposed to open said collar bottom o) then filling said trench with a third poly fill; and p) chemically mechanically polishing said semiconductor substrate.

2. The method of claim 1 wherein, between steps l) and m) the node nitride is transformed to nitrided oxide by steam oxidation.

3. The method of claim 1 wherein, in step c) an optional 3–10 nm thick nitride layer is deposited on the oxide.

4. The method of claim 1 wherein, in step i) forming said buried plate is by plasma doping or gas phase doping with an inert carrier gas and a dopant gas.

5. The method of claim 1 wherein the inert carrier gas is selected from the group consisting of Ar, He, $N_2$ and $H_2$.

6. The method of claim 1 wherein said dopant gas is selected from the group consisting of arsine, tertiarybutylarsinc, trimethylarsenic, triethylarsenic, phosphine, tertiarybutyphosphine, trimethylphosphine, triethylphosphine and diborane.

7. The method of claim 1 wherein sail substrate is silicon.

8. The method of claim 6 wherein said pad nitride comprises silicon nitride.

9. The method of claim 1 wherein said fill material comprises is polysilicon, silicon germanium, or germanium.

10. The method of claim 1 wherein the formed deep trench DRAM cell is a cell in a 256 Mb DRAM.

* * * * *